US012694179B1

(12) United States Patent
Kandula et al.

(10) Patent No.: US 12,694,179 B1
(45) Date of Patent: Jul. 28, 2026

(54) PATH MARGIN MONITORING

(71) Applicant: Synopsys, Inc., Sunnyvale, CA (US)

(72) Inventors: Kranthi Kandula, Telangana (IN);
Ramalingam Kolisetti, Andhra Pradesh
(IN); Firooz Massoudi, Palo Alto, CA
(US); Anubhav Sinha, Telangana (IN);
Sadashiv Chimmad, Karnataka (IN)

(73) Assignee: Synopsys, Inc., Sunnyvale, CA (US)

( * ) Notice: Subject to any disclaimer, the term of this
patent is extended or adjusted under 35
U.S.C. 154(b) by 0 days.

(21) Appl. No.: 18/141,763

(22) Filed: May 1, 2023

(51) Int. Cl.
*G01R 31/3183* (2006.01)
*G01R 31/317* (2006.01)
*G01R 31/3185* (2006.01)
*G06F 30/3312* (2020.01)

(52) U.S. Cl.
CPC ... *G06F 30/3312* (2020.01); *G01R 31/31723*
(2013.01); *G01R 31/318307* (2013.01); *G01R*
*31/318536* (2013.01)

(58) Field of Classification Search
CPC ...... G01R 31/318307; G01R 31/31723; G01R
31/318536; G06F 30/3312; G06F 30/33
See application file for complete search history.

(56) References Cited

U.S. PATENT DOCUMENTS

2005/0182587 A1* 8/2005 Sato ................. G01R 31/31704
702/117
2009/0094565 A1 4/2009 Lackey et al.

2010/0153896 A1 6/2010 Sewall et al.
2011/0267096 A1* 11/2011 Chlipala .......... G01R 31/31858
326/16
2013/0305106 A1* 11/2013 Mittal ............ G01R 31/318536
714/E11.155
2015/0228358 A1* 8/2015 Agata .................. G11C 29/023
714/718
2016/0320448 A1* 11/2016 Chakraborty ...... G01R 31/3172
2021/0191452 A1* 6/2021 Herberholz ......... G06F 30/3312

FOREIGN PATENT DOCUMENTS

CN 115293083 A * 11/2022 ............... G06N 3/08
WO WO-2021074484 A1 * 4/2021 ......... G01R 31/3016
WO WO-2022009199 A1 * 1/2022 ......... G01R 31/3016

* cited by examiner

*Primary Examiner* — Mark D Featherstone
*Assistant Examiner* — Jeffrey Andrew Yang
(74) *Attorney, Agent, or Firm* — Lowenstein Sandler LLP

(57) ABSTRACT

A method includes determining a plurality of threshold
margins corresponding to a plurality of functional paths in
an electronic circuit. The method further includes storing the
plurality of threshold margins corresponding to the plurality
of functional paths in a memory. The method further
includes receiving a first trigger from a processing device.
The method further includes responsive to receiving the first
trigger, monitoring at least one of the plurality of threshold
margins corresponding to at least one of the plurality of
functional paths in view of a previously determined thresh-
old margin stored in the memory and corresponding to the
at least one of the plurality functional paths.

20 Claims, 10 Drawing Sheets

SCAN Mode 600

SCAN_CLK

Scan
Enable 602

Capture
Cycle 608

Capture
Cycle 608

Scan In
604

Path Sel/Delay Sel Load

PMM
Capture

Path Sel/Delay Sel Load

PMM
Capture

Path Sel/Delay Sel Load

Scan Out
606

Don't Care

Capture/Shadow Unload

Capture/Shadow Unload

Capture/Shadow Unload

Pattern 1

Pattern 2

Pattern 3

PATH MARGIN MONITORING

TECHNICAL FIELD

The present disclosure generally relates to a functional path monitoring method for an electronic circuit. In particular, the present disclosure relates to in-situ monitoring of timing margins of functional paths in integrated circuits.

BACKGROUND

As technology nodes shrink and the complexity and gate count of devices increase, the traditional methods of characterization at manufacturing are not sufficient to optimize performance in the field. With the advent of critical mission mode applications like automotive electronics or health monitoring devices, failure avoidance and prediction are increasingly important requirements for the control electronics of such critical mission mode applications. Currently, ring oscillators and other process, voltage and temperature monitors may be used to measure various parameters in an operating device in the field. However, their accuracy, scope and usage are limited.

SUMMARY

In one aspect of the present disclosure, a method includes determining a plurality of threshold margins corresponding to a plurality of functional paths in an electronic circuit. The method further includes storing the plurality of threshold margins corresponding to the plurality of functional paths in a memory. The method further includes receiving a first trigger from a processing device. The method further includes, responsive to receiving the first trigger, monitoring at least one of the plurality of threshold margins corresponding to at least one of the plurality functional paths in view of a previously determined threshold point stored in the memory and corresponding to the at least one of the plurality functional paths.

In another aspect of the disclosure, a non-transitory machine-readable storage medium is disclosed. The storage medium stores instructions which, when executed, cause a processing device to perform operations. The operations include determining a plurality of threshold margins corresponding to a plurality of functional paths in an electronic circuit. The operations further include storing the plurality of threshold margins corresponding to the plurality of functional paths in a memory. The operations further include receiving a first trigger from a processing device. The operations further include, responsive to receiving the first trigger, monitoring at least one of the plurality of threshold margins corresponding to at least one of the plurality functional paths in view of a previously determined threshold margins stored in the memory and corresponding to the at least one of the plurality functional paths.

In another aspect of the disclosure a system includes a memory and a processing device coupled to the memory. The processing device is to determine a plurality of threshold margins corresponding to a plurality of functional paths in an electronic circuit. The processing device is to further store the plurality of threshold margins corresponding to the plurality of functional paths in a memory. The processing device is to further receive a first trigger from a processing device. The processing device is to further monitor, responsive to receiving the first trigger, at least one of the plurality of threshold margins corresponding to at least one of the plurality functional paths in view of a previously determined threshold point stored in the memory and corresponding to the at least one of the plurality functional paths.

Other aspects include components, devices, systems, improvements, methods, processes, applications, computer readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
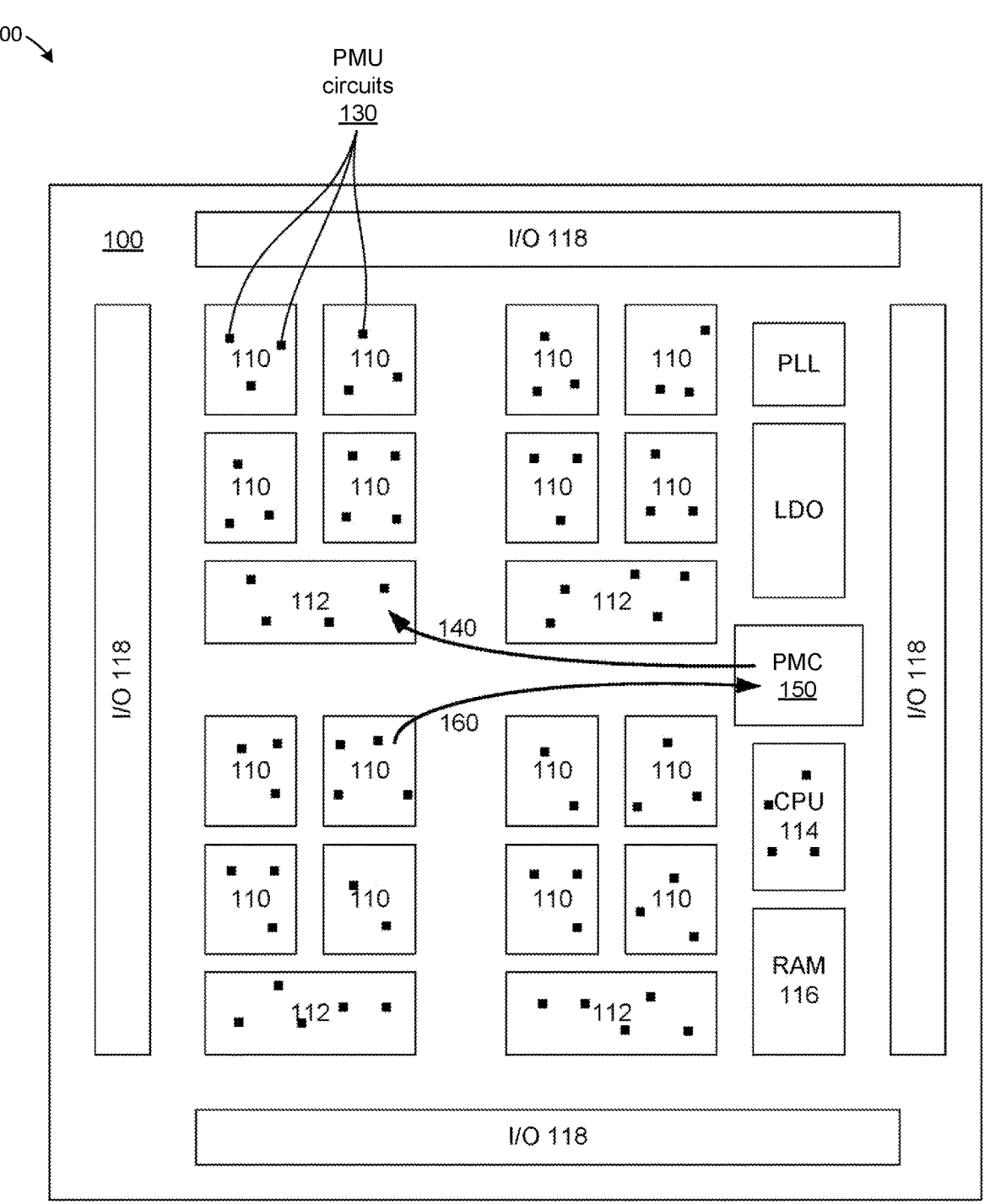
FIG. 1 is a block diagram of an integrated circuit with a built-in path margin monitoring (PMM) system, in accordance with some embodiments of the present disclosure.

Aspects of the present disclosure relate to path margin monitoring. In digital circuits, signals propagate between sequential circuits, such as flip flops and registers, according to timing determined by clocks. For clarity, the propagating signals will be referred to herein as functional signals to distinguish them from the clock signals. In order for digital circuits to function properly, the functional signals must arrive at the next sequential circuit at least a certain amount of time before the relevant clock signal (i.e., before the current clock cycle ends). The difference between when the functional signal arrives and the latest time when it could arrive is referred to as the timing margin, path margin, threshold margin, or simply margin. The latest time when the functional signal could arrive is referred to as the threshold point.

During the design of the integrated circuit, the timing of the circuit can be simulated to ensure that there is sufficient margin (e.g., a margin satisfying a threshold margin) along the different functional paths in the integrated circuit. However, the actual margins in a fabricated chip may differ from the simulations, and the margins may change as a function of temperature and voltage. Moreover, the margins may also change over time as the chip ages. As a result, it would be beneficial to have the ability to characterize and monitor actual margins across different locations in an operating chip.

In one aspect of the present disclosure, this is achieved by implementing a path margin monitoring method. The method includes using a path margin monitor (PMM) (e.g., a path monitoring unit (PMU)) to determine threshold margins and threshold points corresponding to functional paths in an electronic circuit. The threshold margins and threshold points corresponding to the functional paths can be stored in a memory. In one embodiment, the PMM includes a path select multiplexer and a delay select multiplexer. By selecting a functional path using the path select multiplexer and selecting a delay to be applied to the selected functional path using the delay select multiplexer, a functional signal can be sent via the selected functional path. The selected functional path has an associated a functional path time (i.e., the amount of time it takes the functional signal to arrive at the next sequential circuit). It can be determined if the functional path time with the delay applied exceeds the associated threshold point and exceeds the associated threshold margin. If the functional path time with the delay applied exceeds the associated threshold margin, this can be indicative of a degradation of the functional path (and consequently the path margin).

This method may be performed by implementing a path margin monitoring system as part of an integrated circuit. The system includes PMU circuits distributed throughout the integrated circuit. The instances of the PMU circuits measure path margins along different functional paths in the integrated circuit. The system also includes a controller as part of the integrated circuit. The controller controls the instances of the PMU circuits, and also receives and analyzes the data produced by the PMU circuits. For example, the controller may analyze the signals from the PMU circuits (PMM signals) to determine the amount of the lowest path margin from among the set of functional paths monitored by a PMM circuit. The controller may then set the PMU circuits to monitor this slowest functional path to detect degradation in the path margin.

The method described herein and the capabilities of the PMM system may be used during manufacturing, test and/or calibration. They may also be used to monitor the integrated circuit during normal operation of the chip. The PMU circuits preferably are small, so that many of them may be distributed throughout the integrated circuit. For example, each PMM circuit may contain approximately 150 gates. As a result, path margins across an integrated circuit may be monitored more accurately and more thoroughly. This enables real-time monitoring of the integrated circuit performance, and earlier identification and detection of possible problems. The path margin data may also be combined with process, voltage, temperature (PVT) and other sensor data to provide a more accurate insight into the device reliability and to enable power/performance optimization during normal operation.

Technical advantages of the present disclosure include, but are not limited to higher accuracy, broader scope, and expanded usage (e.g., in-field as well as during testing). The ability to monitor path margins in real-time in the field during mission mode (in-field) can have many advantages. For example, cross talk and aging effects of functional paths may be captured and monitored over time. Direct measurement of path margins makes it possible to correlate measured margins with simulations and pre-silicon timing estimates. Measured path margins may be used to improve libraries and timing models. Path margin data can also be used to improve yield analysis. PMMs can also be used to measure toggle rates (the rate at which a signal switches), which is important in monitoring aging and mean time between failure (MTBF) analyses. PMMs may also enable better in-field performance optimization and enhanced voltage/frequency scaling.

PMM data collected during a manufacturing test can be used to measure early threshold margins for functional path failures, which can be used in functional mode for monitoring the degradation of paths. This can be useful for silicon lifecycle management—to diagnose the health of silicon, predict failures, and take preventive measures to improve the lifecycle of chip. PMM data collected during a manufacturing test can also be used for refining the library design models.

As an example, FIG. 1 is a block diagram of an integrated circuit with a built-in path margin monitoring system, in accordance with some embodiments of the present disclosure. In this particular example, the integrated circuit 100 is partitioned into four sectors, each with four processor cores 110 and associated logic 112. The integrated circuit also includes a master central processing unit (CPU) 114, on-chip memory 116, and input/output (I/O) functions 118 such as serializer/deserializer (Serdes), Peripheral Component Interconnect Express (PCIe), High-Definition Multimedia Interface (HDMI), and double data rate (DDR).

The PMM system includes instances of PMU circuits (e.g., PMUs), shown as black squares some of which are labelled 130, and a PMM controller (PMC) 150. Instances of the PMU circuits 130 are distributed throughout the integrated circuit in order to monitor path margins at different points across the integrated circuit. In FIG. 1, for convenience, PMU circuits 130 are not shown in every block. In alternate embodiments, PMU circuits 130 may be inserted in other blocks as well. As some examples, PMU circuits can be used for memory I/O delay measurements and can also be used for chip I/O delay measurements.

The PMU circuits 130 are integrated alongside the functional paths being monitored. As a result, the integrated circuit may be monitored in real-time during normal operation. Normal operation is sometimes referred to as mission mode or in-field. That is, the PMU circuits do not require a special monitor mode, and mission mode need not be interrupted in order to take path margin measurements.

The PMC 150 is also integrated on-chip. In FIG. 1, it is shown as one block, but it may be implemented in a distributed fashion. The PMC 150 communicates with the PMU circuits 130. The controller 150 sends control signals 140 to the PMU circuits 130. For example, the PMM system may have different modes of operation. Scan mode, monitoring mode, and calibration mode are three modes described briefly here. In scan mode, the PMM system performs a sequence of measurement steps to determine the path margins corresponding to paths monitored by a PMM circuit, and the maximum amount of allowable path delay (threshold point) for each functional path. In monitor mode, the PMM system continuously monitors the paths to detect and/or predict changes in the margin for these paths. In calibration mode, the PMM system determines updated path margins corresponding to paths monitored by a PMM circuit that have degraded, and the updated maximum amount of allowable path delay (updated threshold point) for each degraded functional path. The PMC 150 sends control signals 140 to the PMU circuits to configure them for the current mode of operation.

The PMC 150 also receives data from the PMU circuits. This includes the PMM signals 160, which are the output produced by the PMU circuits 130 from their measurement of path margins (threshold margins). The controller 150 analyzes the PMM signals 160, thus providing a path margin monitoring capability across the integrated circuit. For example, it may combine the data from the individual PMU circuits 130 to provide a chip-level model of the path margin.

Because both the PMU circuits 130 and the PMC 150 are on-chip, the PMM system may provide real-time in-situ monitoring of path margins across the integrated circuit. The data produced by the PMM system may be consumed on-chip. For example, path margin is affected by operating voltage, temperature and clock speed. The path margin measurements may be used as feedback to other circuitry on the chip, which may alter their operation accordingly. For example, if path margin starts to degrade in a section of the chip, the clock speed may be decreased, or thermal heat accumulation may be decreased by increasing cooling or reducing power consumption. On the other hand, if there is excess path margin in a section of the chip, the clock speed may be increased, or thermal heat accumulation may be allowed to increase by decreasing cooling or increasing power consumption. The collected PMM data may be used to explore operational limits such as clock speed and voltage.

The PMM data produced by the PMM system may also be used to monitor changes in path margin over the lifetime of the chip. Current PMM data may be compared to historical data to identify trends and predict future problems. The PMM data may also be analyzed off-chip. For example, more complex analysis may require computational resources that are not available on-chip, and storage of PMM data captured over long periods of time may require more space than is available on-chip. Analysis may also combine the PMM data with other data that is not available on-chip, for example external measurements of temperature or power consumption. As another example, PMM data from multiple chips may be analyzed together to provide a view of a board, a rack-mounted device or other environment that is larger than just a single chip.

Figure 2A:
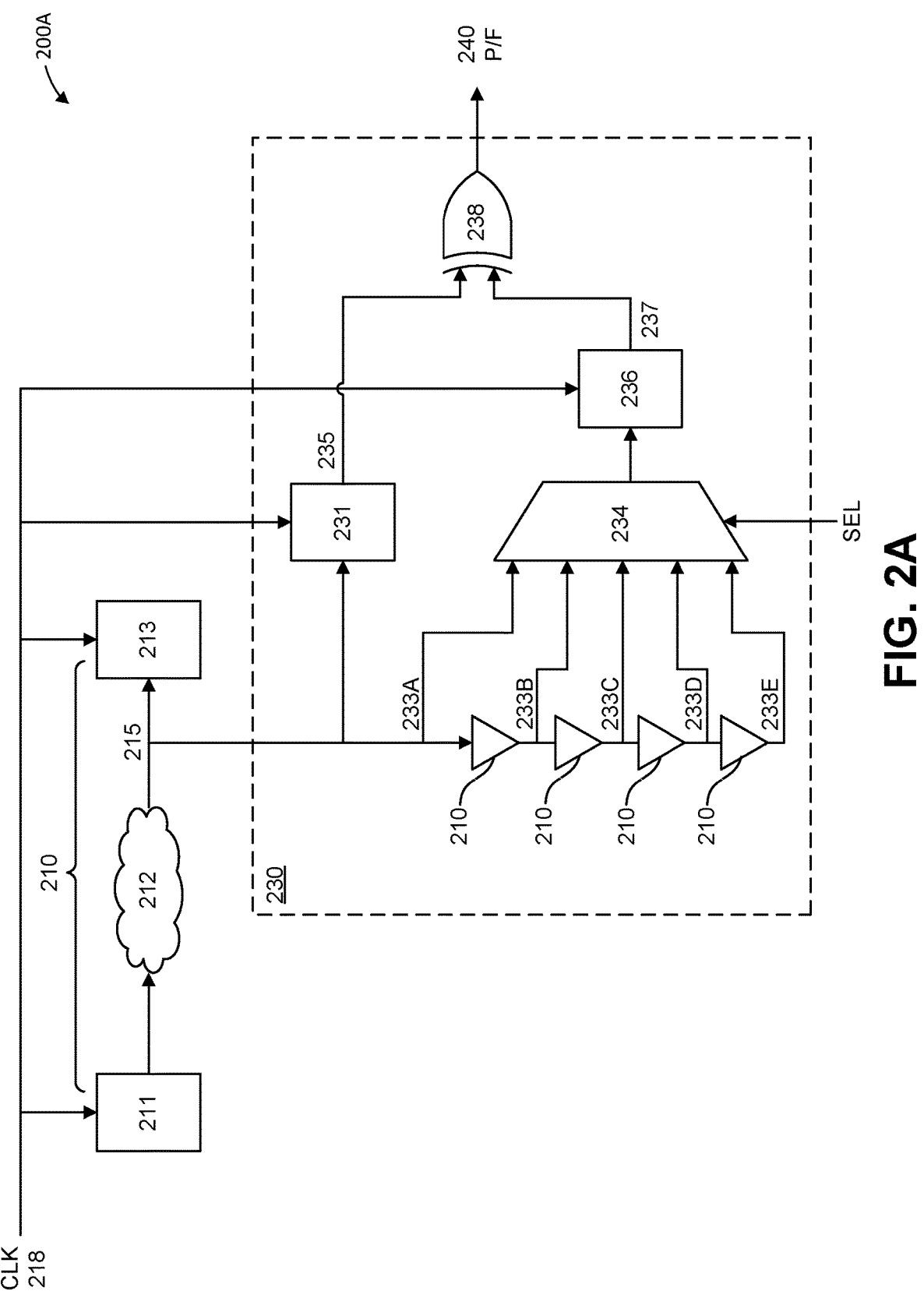
FIG. 2A is a block diagram of a PMM circuit, in accordance with some embodiments of the present disclosure.
Figure 2B:
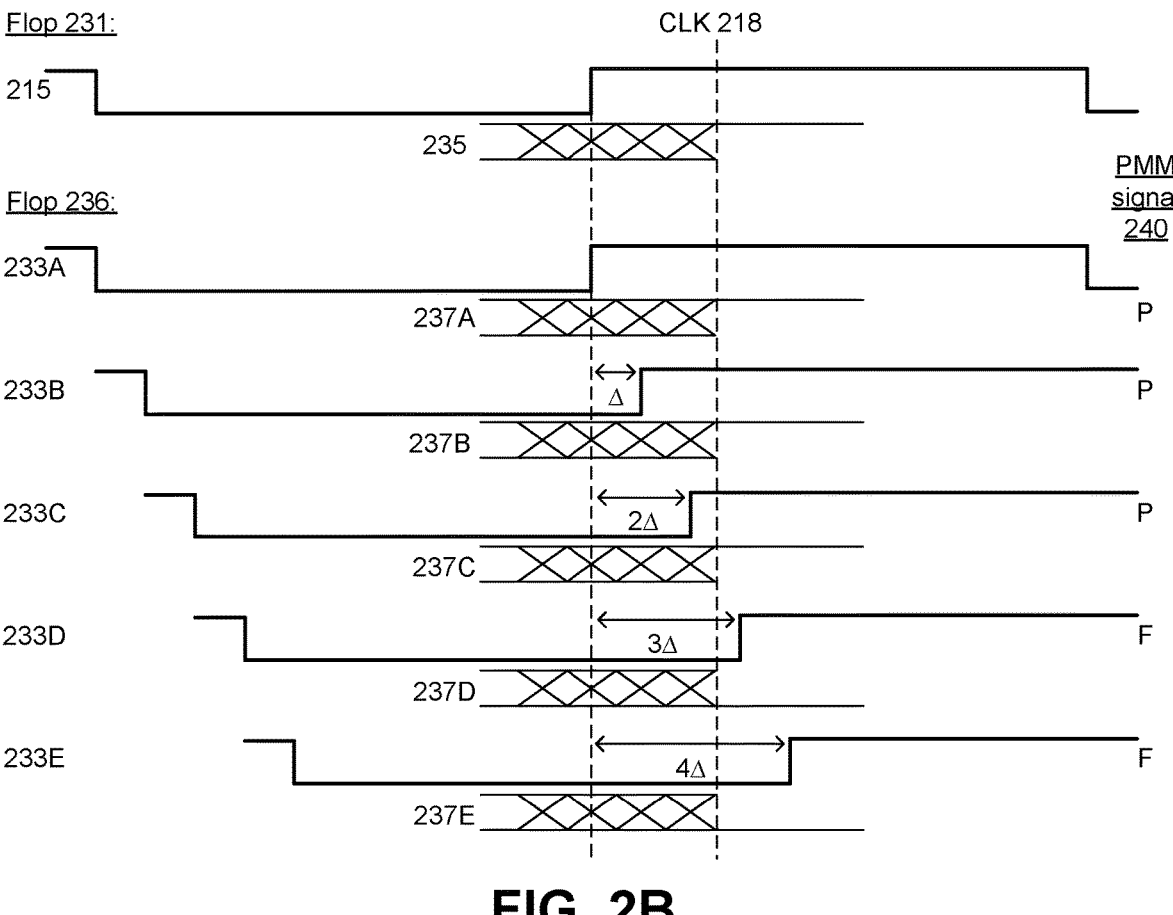
FIG. 2B is a timing diagram showing operation of the PMM circuit of FIG. 2A.

FIG. 2A is a block diagram of a PMM circuit 200A, in accordance with some embodiments of the present disclosure. FIG. 2B is a timing diagram showing operation of the PMM circuit of FIG. 2A. FIG. 2A shows a functional path 210 which originates at sequential circuit 211, propagates through combinational circuitry 212 and terminates at sequential circuit 213. In this example, the sequential circuits 211, 213 are flip flops (also referred to as flops herein), and the originating flop 211 and terminal flop 213 are both clocked by clock signal 218. In some embodiments, clock signal 218 operates at a certain clock frequency correlating a to a clock time period (e.g., the time to complete one clock cycle). This example shows one originating flop 211 for clarity, but there may be multiple originating flops to produce the functional signal received by the terminal flop 213. The signals propagating along the functional path 210 will be referred to as functional signals 215, to avoid confusion with the clock signal 218.

The PMM circuit 230 monitors the path margin of this functional path 210. The PMM circuit 230 receives both the functional signal 215 and the clock signal 218, and outputs a PMM signal 240 that is indicative of the path margin for the functional path 210. The PMM circuit 230 includes two flip flops 231, 236, both of which are the same as flip flop 213 and also clocked by clock signal 218. In some embodiments, flop 231 is referred to as shadow and flop 236 is referred to as capture. Flop 231 receives the functional signal 215. Flop 236 receives a delayed version of the functional signal 215. Here, the functional signal 215 is input to a chain of delay buffers 232, each of which adds some delay A. At each point along the chain, the functional signal is delayed by a different amount. These delayed versions 233A-E are inputs to a multiplexer 234, which selects which delayed version to send to flop 236. The SEL signal to the multiplexer is determined by the PMC, either directly or indirectly. For example, the controller may set the operating mode of the PMM circuit, which then determines the sequence of SEL signals applied over time. Alternatively, the controller may send SEL signals directly to the multiplexer. A comparator 238 (e.g., XOR or XNOR) compares the un-delayed version 235 from flop 231 and the selected delayed version 237 from flop 236. The output is indicated as either a pass (P) if the two inputs 235 and 237 are the same, or a fail (F) if the two inputs 235 and 237 are different at a particular time.

FIG. 2B is a timing diagram illustrating this operation. In this example, the functional signal 215 is toggling between 0 and 1. Five delayed versions 233A-E are shown, with delays ranging from 0 for 233A to 4Δ for 233E, where Δ is the delay introduced by a single buffer. The delay per buffer depends on the technology node. For example, at more advanced nodes, the delay per buffer may be about 15 ps. The number of buffers may also vary. For example, 8 or 16 buffers may be used. The timing of the flops 231, 236 is determined by the clock signal 218. FIG. 2B shows a dashed line at the time point where the clock signal 218 causes the flops 231, 236 to capture their input values. Flop 231 receives the functional signal 215 and captures a logic 1. It outputs signal 235. For clarity, output signal 235 is shown only after the CLK trigger 218. Version 233A has zero delay and flop 236 would also capture a logic 1 if this version is selected by the multiplexer 234 with the corresponding output 237A. Versions 233B and C have increasing delay but the logic 1 value still arrives in sufficient time to be captured by flop 236, resulting in output signals 237B and C. In versions 233D and E, the delay exceeds the available threshold margin so the flop 236 would capture the next bit instead, which is the output signal 237D and E of logic 0. The corresponding output 240 of the comparator is shown in the right column. P stands for pass, meaning that the functional path has sufficient path margin to continue to operate correctly even with the additional time delay. F stands for fail, meaning that the path margin is not sufficient to accommodate the additional delay. Versions 233A-C pass and versions 233D-E fail. From this, it can be deduced that the actual path margin is between 2Δ and 3Δ.

In the example circuit shown in FIG. 2A, not all of the delayed versions 233A-E are compared on every clock cycle. Rather, on each clock cycle, only one delayed version is selected by multiplexer 234. Other delayed versions are compared on other clock cycles. In an alternative version, multiple values could be compared on a single clock cycle if additional flops were added to capture the different versions. However, this adds area to the PMM circuit, which would be multiplied by the number of PMU circuits on the chip.

In addition, a comparator output indicating a pass P may be generated in two different ways. If the functional signal 215 changes value and the delay introduced is less than the current path margin, then the comparator will output a pass P, as shown for versions 233A-C in FIG. 2B. However, if the functional signal does not change value, for example if there are a series of logic 1's in a row, then the comparator will also output a pass P even if the delay exceeds the current path margin. One challenge is that the data flowing through the functional paths during mission mode is not controlled, so the PMM system may not be able to determine that the functional signal is changing value. One way to address this effect is to add circuitry to determine whether the functional signal is changing value, at the expense of added area. Another way to mitigate this effect is to take multiple samples, which increases the chances of sampling a functional signal that is changing value. As a result, an initial determination of the path margin may require multiple clock cycles.

Figure 2C:
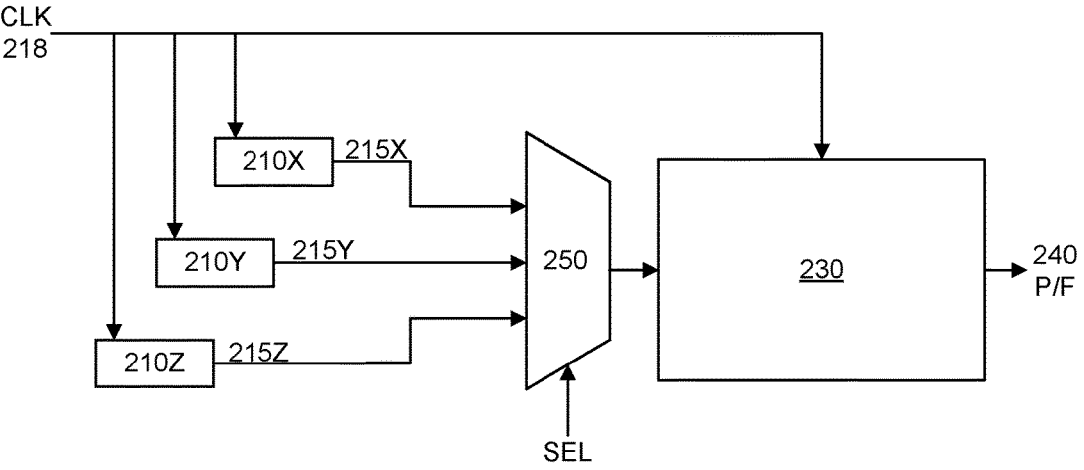
FIG. 2C is a block diagram of multiple functional paths multiplexed to a PMM circuit, in accordance with some embodiments of the present disclosure.

FIG. 2A shows a single functional signal 215, produced by a functional path 210 to a single flop 213. If multiple functional paths and functional signals are monitored, the same PMM circuit 230 could be shared by adding a multiplexer 250 at the input to circuit 230, as shown in FIG. 2C. In FIG. 2C, there are multiple functional paths 210X, Y, Z, each of which is clocked by CLK 218 and produces corresponding functional signal 215X, Y, Z. These are used as the different inputs to the multiplexer 250, with the multiplexer selecting which signal to connect to the PMM circuit 230.

Figure 3:
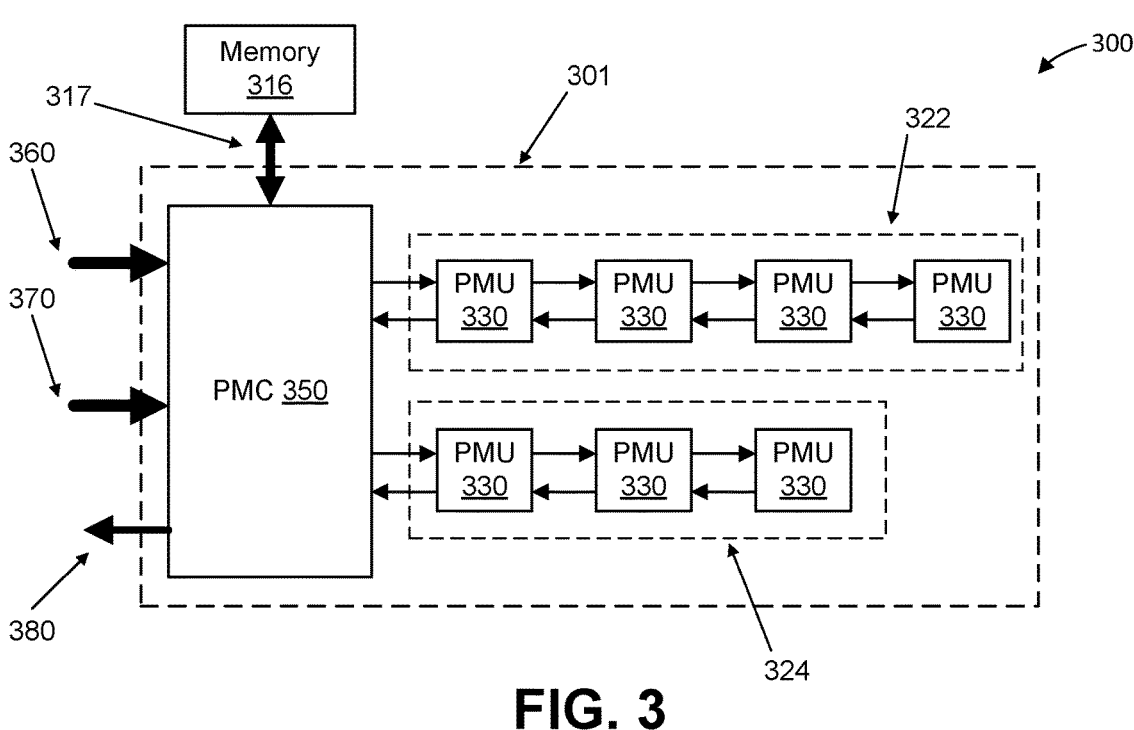
FIG. 3 is a block diagram of a PMM system, in accordance with some embodiments of the present disclosure.

FIG. 3 is a block diagram of a PMM system 300, in accordance with some embodiments of the present disclosure. FIG. 3 shows the high-level architecture of a path margin monitor, according to some embodiments. PMM system 300 includes a path margin monitor 301 including multiple PMUs 330, a PMC 350 with a functional interface 360, a test interface 370, a memory interface 317, and an alert/interrupt signal 380. PMM system 300 further includes a memory 316 coupled to memory interface 317.

In some embodiments, a path margin monitor 301 includes a Path Margin Controller (PMC) 350 (e.g., a central controller) and multiple Path Margin Units (PMU) 330 spread across the system on a chip (SoC) which monitor the functional paths. PMU 330 is the main core block to which functional paths are connected, and data is captured by adding additional incremental delay paths to determine threshold margins and threshold points (e.g., the last amount of delay that still give a pass). Multiple PMUs 330 may be spread across the SoC and are connected serially in a loop. In some embodiments, there are multiple loops of PMUs 330 coupled to PMC 350. For example, in some embodiments PMU loop 322 includes four PMUs 330 connected serially and coupled to PMC 350. PMU loop 324 includes three PMUs 330 connected serially and coupled to PMC 350.

In some embodiments, PMC 350 can interface with multiple PMU loops (e.g., PMU loops 322 and 324) across different power domains. In some embodiments, PMC 350 supports functional interface 360 and test interface 370 for in-field and manufacturing (i.e., test) modes respectively. Autonomous operation of PMM 301 by preloading PMM data packets into memory 316 via memory interface 317 is also supported for in-field operation through functional interface 360.

In some embodiments, PMM system 300 can run in manufacturing test and in-field. PMC 350 includes functional interface 360. Functional interface 360 may be used to enable PMM 301 operation in mission mode (e.g., in-field). Test interface 370 may be accessed during manufacturing test mode. In some embodiments, functional interface 360 may be an advanced peripheral bus (APB) interface and/or the like. In some embodiments, test interface 370 may be a

1687/1500 interface, Joint Test Action Group (JTAG) interface, Test Access Port (TAP) interface, and/or the like.

In some embodiments, memory 316 may be connected to PMC 350. PMM packets may be pre-loaded to enable autonomous operation of the PMM 301 during in-field or mission mode.

In some embodiments, PMC 350 is triggered through test interface 370 to run characterization patterns for arriving at threshold points and subsequently threshold margins for functional paths. PMC 350 configures the path select and delay select for PMU 330 (e.g., through Test Data Registers (TDR) or scan chains), after which functional paths are loaded through deterministic values by ATPG path delay patterns and a response is collected from PMU 330 flops (e.g., shadow and capture) through scan chains. In some embodiments, this process is repeated for all the path selects and delay selects, and the responses are analyzed of-chip to arrive at the threshold margins and threshold points for all functional paths connected to PMU 330. In some embodiments, PMU data loading/unloading is completed via scan chains and ATPG enabled PMM calibration during a manufacturing test.

In some embodiments, during infield, memory 316 is pre-loaded with PMM packets containing threshold margins (e.g., derived from a functional path time and a threshold point) determined during manufacturing test. PMC 350 is triggered through functional interface 360 to run in monitor mode to continuously monitor for any degradation of functional paths. After triggering PMC 350 runs autonomously, it fetches the PMM packets from memory and configures PMU 330 with the threshold margins of path select and delay select and then continuously monitors the functional paths. In case of degradation of a functional path a fail is reported (e.g., via PMM signal 240 of FIG. 2B) to a processor (e.g., CPU 114 of FIG. 1) and PMC 350 recalibrates updated threshold margins (e.g., derived from an updated functional path time and an updated threshold point) by running detection patterns in-field. In case of no failure, the processor (e.g., CPU 114 of FIG. 1) interrupts the autonomous operation of PMC 350 and re-starts the operation by loading PMUs 330 with threshold margins (e.g., corresponding to different functional paths) for different functional path selection and monitoring.

In some embodiments, PMM packets are loaded into memory 316. In some embodiments, threshold margins may be determined during manufacturing test.

In some embodiments, PMC 350 is triggered through functional interface 360 for monitoring mode. PMC 350 runs autonomously and performs path margin monitoring in monitor mode.

In some embodiments, during monitoring mode PMM packets are fetched from memory 316, memory 316 being preloaded with threshold margins. In some embodiments, PMMs 330 are configured by loading the path delay and path select flops into PMMs 330 through memory interface 317. In some embodiments, memory interface 317 may be a serial interface and/or the like.

In some embodiments, in case of degradation of functional path 330, PMU flops collect fail status, and an alert is issued by PMC 350 via alert/interrupt signal 380 to processor (e.g., CPU 114 of FIG. 1). In some embodiments, after a failure is detected (e.g., functional path degradation is detected) by PMU 330 and an alert is issued by PMC 350, PMC 350 goes into calibration mode. In some embodiments, in calibration mode PMC 350 reads the value of the PMU status flops (not shown in figures) through a serial interface.

For example, a status flop captures a PMM signal (e.g., PMM signal 240 of FIG. 2A).

In some embodiments, upon detecting a failure, PMC 350 recalibrates the PMU 330 by running characterization patterns again in-field (e.g., determines updated functional path times, threshold points, and threshold margins). PMC 350 stores new threshold margins into memory 316. In some embodiments, the new threshold margins are stored in memory 316 as PMM packets. Functional path monitoring is then completed using new threshold margin settings.

In some embodiments, PMM operation for monitoring functional paths and re-calibration (determining updated threshold margins after degradation is detected) can be performed alternatively through test interface 370. PMM operation through test interface 370 may have no autonomous mode operation and a processor (e.g., CPU 114 of FIG. 1) needs to continuously feed PMM packets serially through test interface 370. This operation may run at a test clock frequency. In some embodiments, PMM operation through test interface 370 may be run during in-system.

Figure 4:
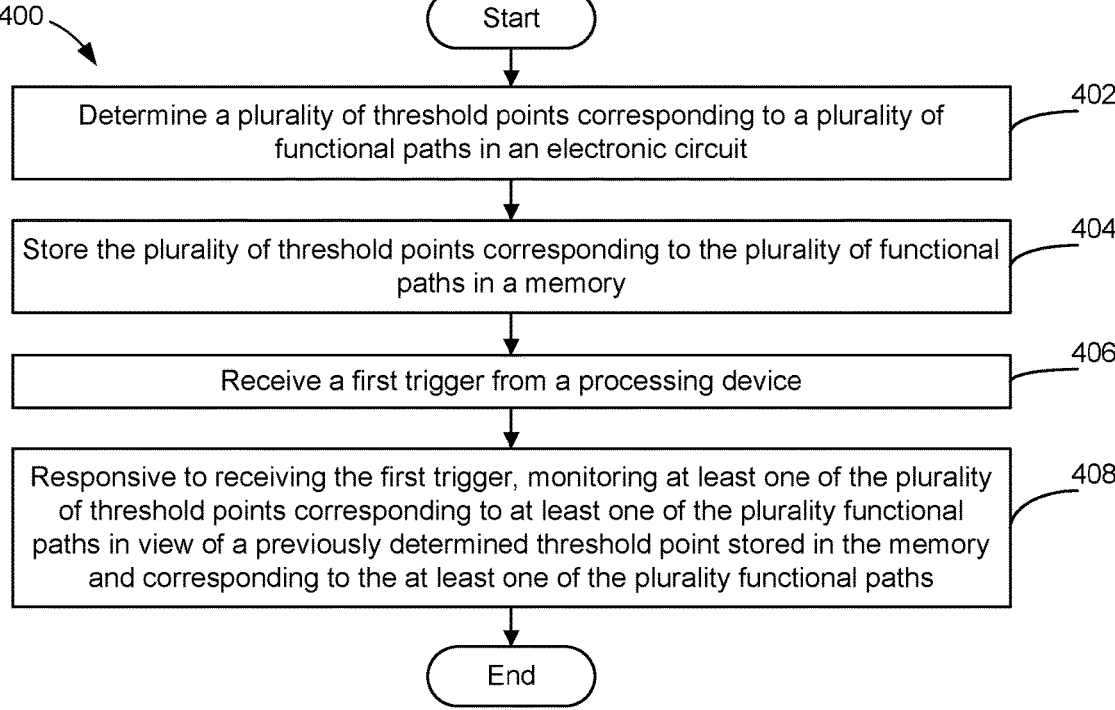
FIG. 4 is a flow diagram of a method associated with path margin monitoring, in accordance with some embodiments of the present disclosure.

FIG. 4 is a flow diagram of a method associated with path margin monitoring, in accordance with some embodiments of the present disclosure. The method 400 may be performed by processing logic that includes hardware (e.g., circuitry, dedicated logic, programmable logic, microcode, etc.), software (e.g., instructions run on a processor to perform hardware simulation), or a combination thereof. Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment. Other process flows are possible.

Referring again to FIG. 4, at block 402, the processing logic determines a plurality of threshold margins corresponding to a plurality of functional paths in an electronic circuit. In some embodiments, determining the plurality of threshold margins may include configuring a path monitoring unit (PMU) including a path select multiplexer and a delay select multiplexer, the delay select multiplexer having at least one delayed input and one un-delayed input. Determining the plurality of threshold margins may further include selecting a functional path of the plurality of functional paths using the path select multiplexer.

In some embodiments, determining the plurality of threshold margins may further include selecting a delayed input using the delay select multiplexer, wherein the delayed input has a delay, the delay to be applied to the selected functional path of the plurality of functional paths. Determining the plurality of threshold margins may further include sending the functional signal via the selected functional path with the delay applied. Determining the plurality of threshold margins may further include determining if the functional signal fails to reach an end of the selected functional path with the delay applied before a cycle of the clock signal ends.

In some embodiments, determining plurality of threshold margins may further include determining, in response to the functional signal failing to reach the end of the selected functional path with the delay applied before a cycle of the clock signal ends, a threshold margin of the selected functional path based on a greatest amount of delay applied to the functional path where the functional signal reaches the end of the selected functional path with the delay applied before the cycle of the clock signal ends. In some embodiments, detecting a change in the threshold point indicates a degradation of the functional path (e.g., a change in the functional path time) and thus a degradation of the threshold margin.

In some embodiments, determining the plurality of threshold margins may further include storing the determined threshold margin corresponding to the selected functional path in the memory.

In some embodiments, the plurality of threshold margins are determined using automatic test pattern generation (ATPG) test patterns generated using scan chains. In some embodiments, the plurality of threshold margins and ATPG test patterns are stored in the memory as path margin monitoring (PMM) packets.

At block 404, the processing logic stores the plurality of threshold margins corresponding to the plurality of functional paths in a memory.

At block 406, the processing logic receives a first trigger from a processing device.

At block 408, the processing logic, responsive to receiving the first trigger, monitors at least one of the plurality of threshold margins corresponding to at least one of the plurality of functional paths in view of a previously determined threshold margin stored in the memory and corresponding to the at least one of the plurality functional paths.

In some embodiments, the monitoring may include configuring a path monitoring unit (PMU) comprising a path select multiplexer and a delay select multiplexer. The monitoring may further include selecting a functional path of the plurality of functional paths using the path select multiplexer. The monitoring may further include selecting a delay to be applied to the selected functional path of the plurality of functional paths using the delay select multiplexer, the functional path having an associated threshold margin of the plurality of threshold margins.

In some embodiments, the monitoring may include sending a functional signal via the selected functional path, the selected functional path having a functional path time. The monitoring may further include determining if the functional path time with the delay applied exceeds the associated threshold margin. In some embodiments, to determine if the functional path time with a delay applied exceeds the threshold margin, a threshold point is determined and if the functional path with the delay applied exceeds the threshold point (e.g., using a comparator) then the functional path with the delay applied also exceeds the threshold margin.

In some embodiments, in response to determining that the functional path time with the delay applied exceeds the associated threshold margin, the processing logic may further determine an updated functional path time and an updated threshold margin. The processing logic may further store the updated functional path time and updated threshold margin associated with the selected functional path in the memory.

In some embodiments, the processing logic may further initialize a PMM idle state. The processing logic may further wait for the first trigger of block 408 from the processing device. Responsive to receiving the first trigger of block 408, the processing logic may further monitor the at least one of the plurality of threshold margins corresponding to the at least one of the plurality functional paths in view of the previously determined threshold margin stored in the memory and corresponding to the at least one of the plurality functional paths.

In some embodiments, the processing logic may further determine, in response to detecting a degradation of the at least one of the plurality of functional paths, an updated threshold margin corresponding to the at least one of the plurality of functional paths that is degraded. The processing logic further stores the updated threshold margin corresponding to the at least one of the functional paths that is degraded in the memory. The processing logic may further reinitialize the PMM idle state. The processing logic may further wait for a second trigger from the processing device.

In some embodiments, the processing logic may further receive an interrupt from the processing device. The processing logic may further reinitialize the PMM idle state. The processing logic may further wait for a second trigger from the processing device.

Figure 5:
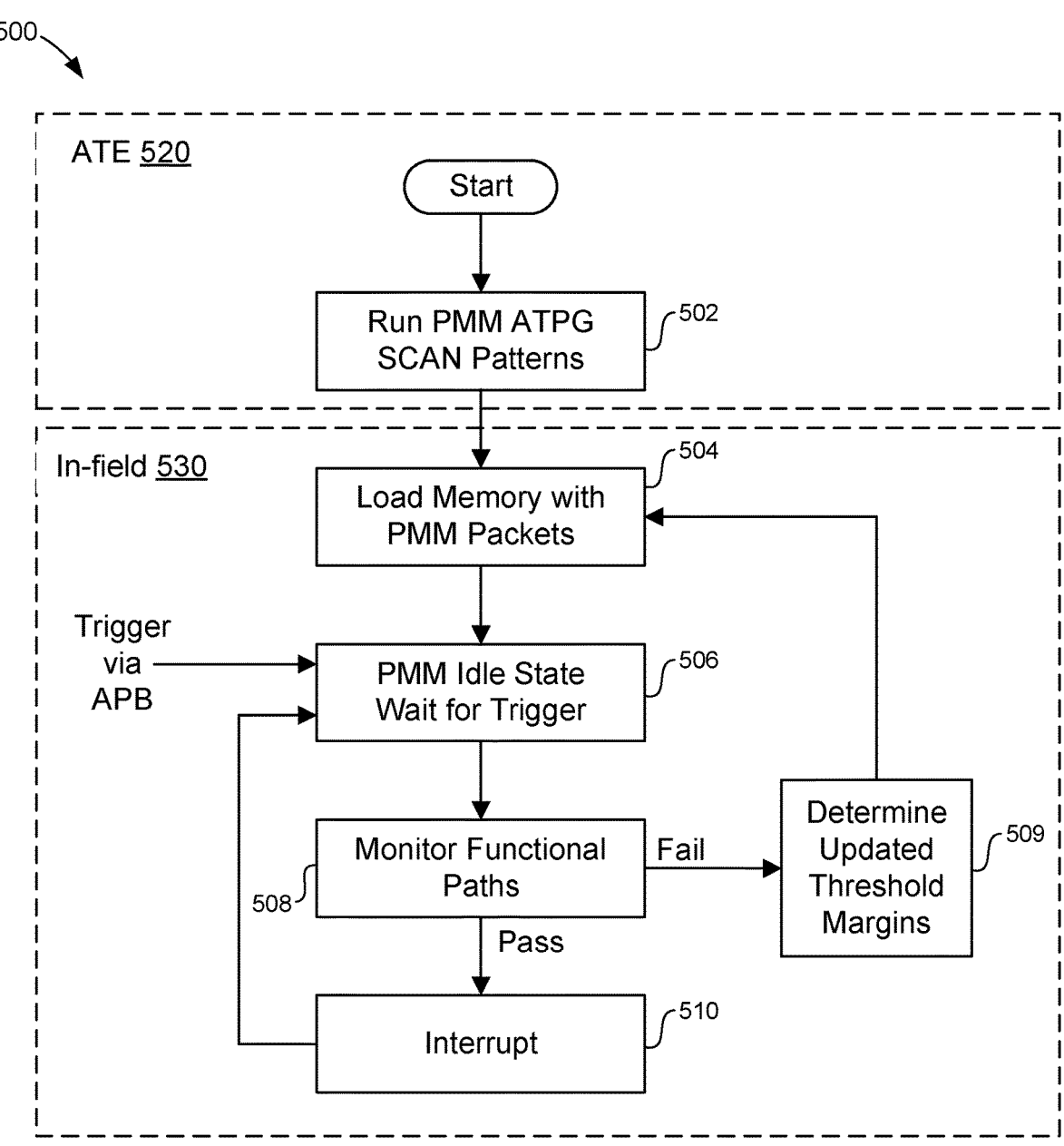
FIG. 5 is a flow diagram of a PMM system, in accordance with some embodiments of the present disclosure.

FIG. 5 is a flow diagram of a PMM system 500, in accordance with some embodiments of the present disclosure.

Referring to FIG. 5, at 502 path margin monitoring is run on ATPG and Scan patterns (test patterns, characterization patterns, etc.). In some embodiments, path and delay selection configurations are determined. In some embodiments, threshold margins may be extracted using path and delay selection configurations. Block 502 may be performed by automated test equipment 520 during testing and/or manufacturing mode (before a device is deployed). In some embodiments determining the threshold margins is referred to as path margin data collection. In some embodiments, path margin data collection can be done both in test mode (ATE 520 before in-field 530) and functional mode (in-field 530).

In some embodiments, path margin data collected at ATE 520 by PMM characterization patterns may be used to derive base line functional path times, threshold margins, threshold points and/or the like. These threshold margins and threshold points may be used in functional mode for monitoring to issue alerts (alert/interrupt signal) and alarms. Path margin data collected at ATE can also be used for silicon to design feedback (e.g., updating combinational logic models used to design chips). In some embodiments, PMM characterization/detection patterns run during manufacturing test are used to derive base line threshold margins and threshold points for functional paths.

In some embodiments, a PMM system performs path margin monitoring. Path margin monitoring may be run during manufacturing test to analyze the threshold margins (e.g., by determining the difference between a functional path time and a threshold point of a functional path) or by detecting a change in the threshold point for functional paths connected to a PMU (e.g., PMU 330).

In some embodiments, determining (extracting) threshold margins includes selecting an un-delayed input to be applied to a functional path using a delay select multiplexer. Delay inputs (selected using the delay select multiplexer and each having a corresponding delay time) are applied to the functional path. The delay inputs are applied starting with smaller delays in ascending order. When each delay is applied, the functional signal is sent via the selected functional path with the delay applied. Using a comparator (e.g., comparator 238) to compare the delayed and un-delayed signal, it is determining if the functional signal fails to reach an end of the selected functional path with the delay applied before a cycle of the clock signal ends.

In some embodiments, if the functional signal fails to reach the end of the functional path with a delay applied before a cycle of the clock signal ends, a threshold point of the functional path may be determined by determining the greatest delay to be applied to the functional path that produce a pass (e.g., that amount of delay being the threshold point). The threshold margin may be determined by calculating the difference between the functional path time and the threshold point. In some embodiments, the threshold margin corresponding to the functional path is stored in the memory.

At 504, the determined threshold margins are loaded into a memory. In some embodiments, the threshold margins may be stored in the memory as PMM packets. In some embodiments, PMM packets may include functional path times, threshold points, threshold margins, test patterns, etc.

Beginning at block 504, the flow may be completed in-field 530. In some embodiments, in-field 530 refers to mission mode (i.e., after a device is deployed and is in use).

At block 506, the PMM enters a PMM idle state and waits for a trigger. In some embodiments, a trigger is received via an APB interface from a processing device (e.g., CPU 114 of FIG. 1). In some embodiments, upon receiving the trigger a PMC (e.g., PMC 350 of FIG. 3) receives stored threshold margins and/or PMM packets from the memory.

At block 508, a PMM system (e.g., PMM system of FIG. 2) monitors the functional paths. If a degradation of a functional path is detected (fail), the flow continues to block 509. If no degradation of a functional path is detected (pass), the flow continues to block 510.

At block 509, the PMM system determines updated threshold margins and the flow returns to block 504. In some embodiments, in case of degradation, PMM system also has the capability to adapt and re-calibrate the threshold margins and threshold points (determine updated threshold margins and/or threshold points) during functional mode.

At block 510, an interrupt is received from the processing device and the flow returns to block 506.

Figure 6A:
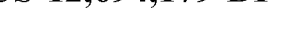
FIG. 6A is a timing diagram showing operation of the PMM circuit in scan mode.

FIG. 6A is a timing diagram showing operation of the PMM circuit in scan mode.

In some embodiments, during scan mode 600 path select and delay select values are configured using the PMM data collected during scan mode 600 (i.e., collection mode, manufacturing testing, etc.). In some embodiments, when a scan enable signal 602 is high path select and delay select values are loaded to memory. When scan enable signal 602 is low during capture cycle 608, PMM system captures threshold margins. In some embodiments, when a scan enable signal 602 is high capture and shadow flop values are unloaded. In some embodiments, PMM data for pattern 1 is captured and loaded/configured during the first scan enable 602 cycle, PMM data for pattern 2 is captured and loaded/configured during the second scan enable 602 cycle, and so forth.

Figure 6B:
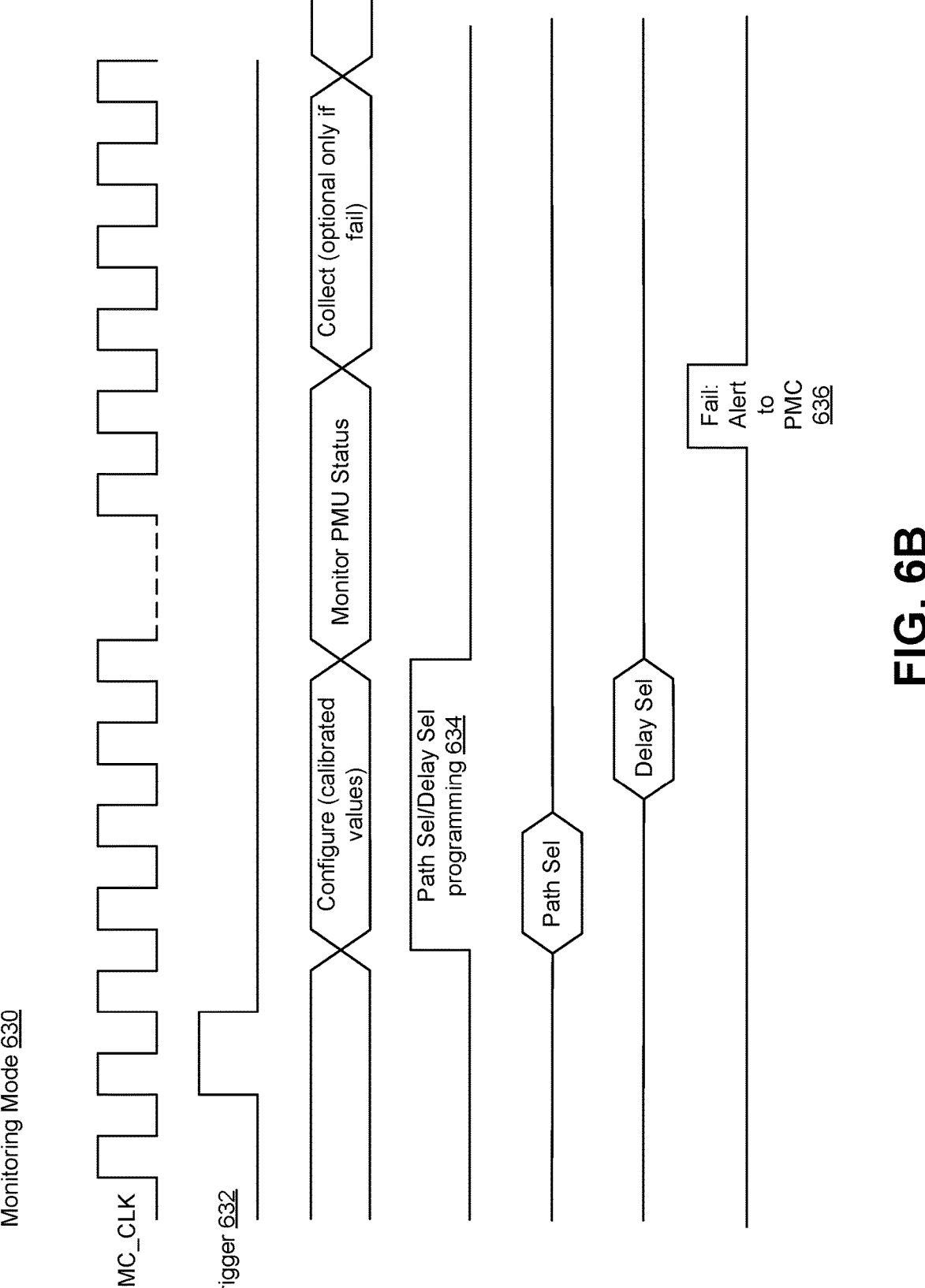
FIG. 6B is a timing diagram showing operation of the PMM circuit in monitoring mode.

FIG. 6B is a timing diagram showing operation of the PMM circuit in monitoring mode 630.

In some embodiments, following a trigger signal 632 PMU is configured with calibrated values (e.g., path select and delay select multiplexers are programmed with threshold margins stored in memory from scan mode) when a path sel/delay sel programming signal 634 is high. In some embodiments, a fail alert to PMC 636 is sent following a failure (degradation) detection during monitoring of PMU status (i.e., degradation detected or not, alert sent or not, etc.). In some embodiments, a collect status follows monitoring if a failure is detected.

Figure 6C:
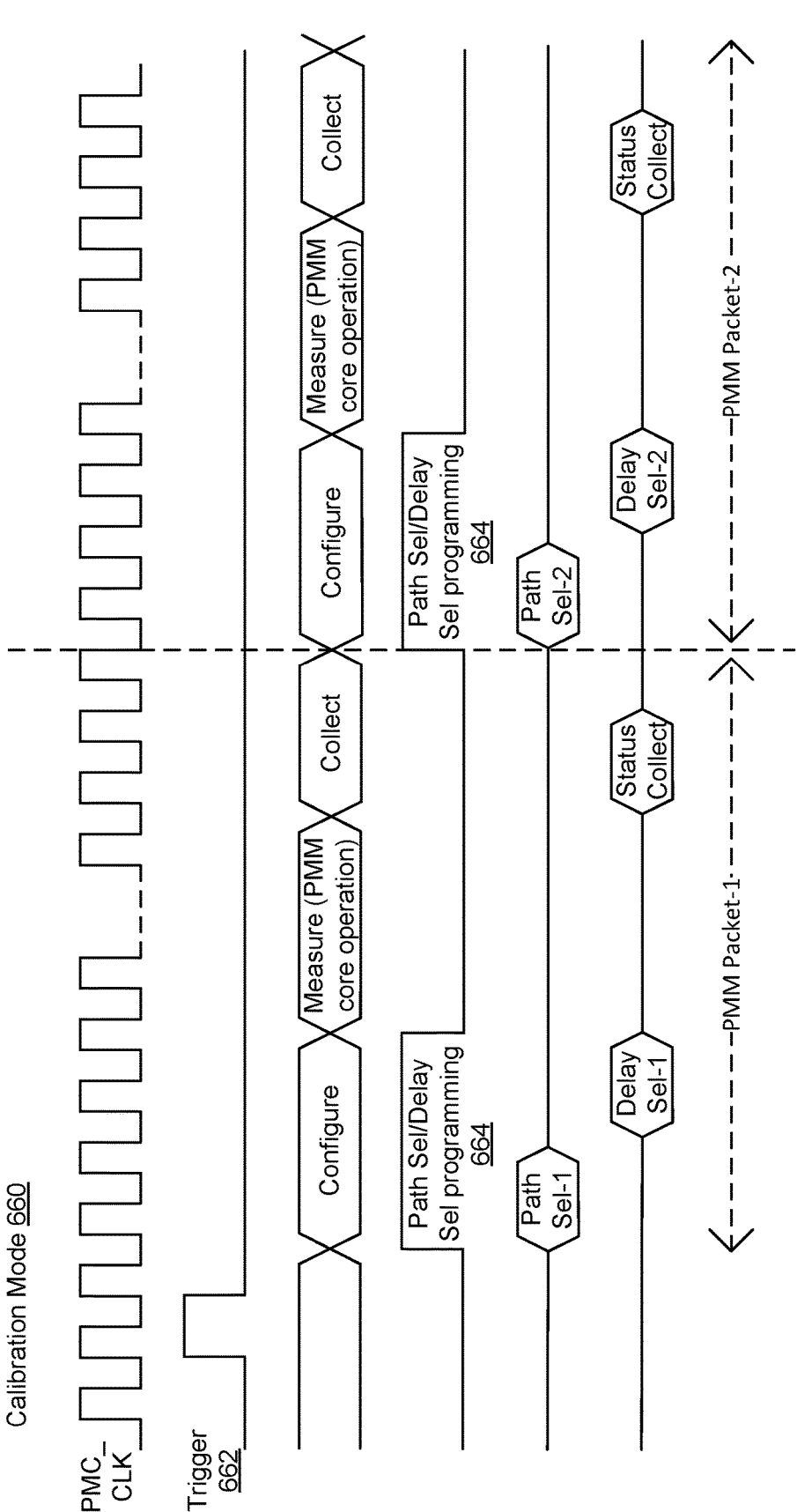
FIG. 6C is a timing diagram showing operation of the PMM circuit in calibration mode.

FIG. 6C is a timing diagram showing operation of the PMM circuit in calibration mode.

In some embodiments, following a trigger signal 662 PMU is configured with calibrated values (e.g., path select and delay select multiplexers are programmed with threshold margins from scan mode) when a path sel/delay sel programming signal 664 is high. In some embodiments, when path sel/delay sel programming signal 664 is high PMU is configured. In some embodiments, PMM data for PMM packet 1 is captured and loaded/configured during a first path sel/delay sel programming signal 664 cycle, PMM data for PMM packet 2 is captured and loaded/configured during a second path sel/delay sel programming signal 664 cycle, and so forth. Calibration mode 660 identifies an updated threshold point and an updated threshold margin following a degradation.

Figure 7:
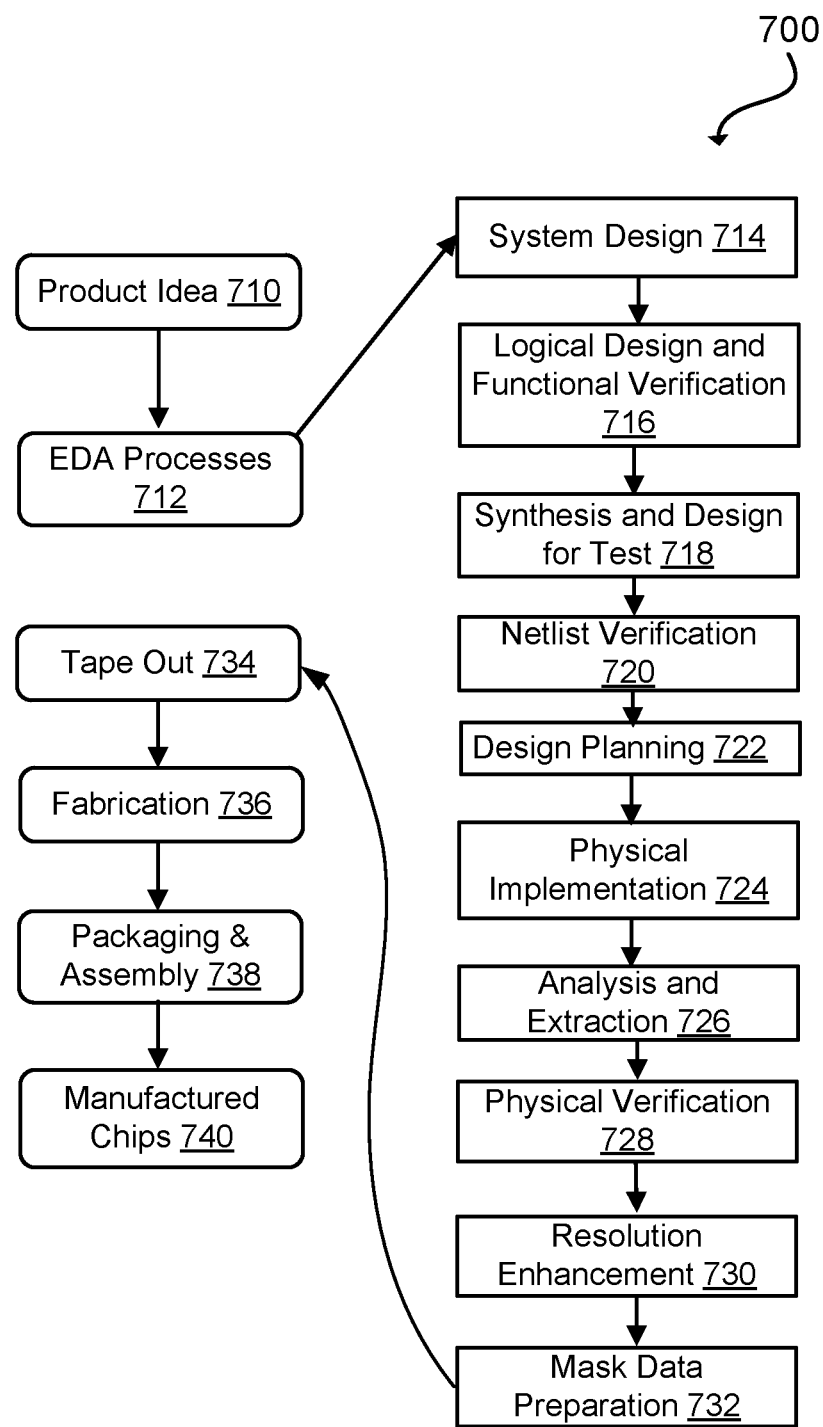
FIG. 7 depicts a flowchart of various processes used during the design and manufacture of an integrated circuit in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 7. The processes described by be enabled by EDA products (or EDA systems).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8, or host system 807 of FIG. 8) may be used to store the programs and data structures that are used by some or all of the EDA products described herein, and products used for development of cells for the library and for physical and logical design that use the library.

Figure 8:
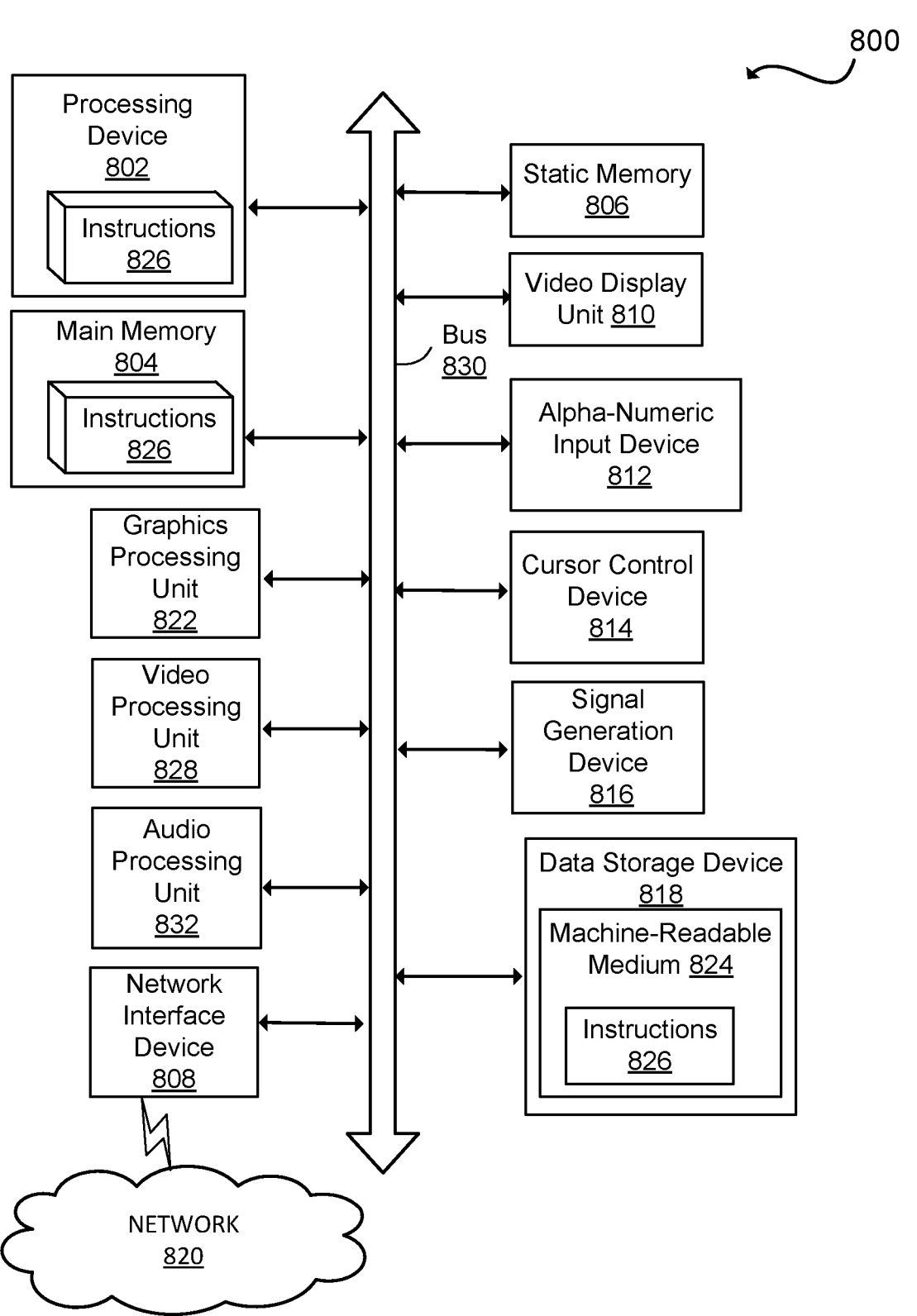
FIG. 8 depicts a diagram of an example computer system in which embodiments of the present disclosure may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed)

network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, which may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
determining a plurality of threshold margins corresponding to a plurality of functional paths in an electronic circuit;
storing the plurality of threshold margins corresponding to the plurality of functional paths in a memory;
receiving a first trigger from a processing device;
responsive to receiving the first trigger, capturing first path margin monitoring (PMM) data from a first section of the electronic circuit and second PMM data from a second section of the electronic circuit during in-field operation of the electronic circuit, wherein the first PMM data and the second PMM data each comprise at least one of the plurality of functional paths corresponding to the plurality of threshold margins in view of a previously determined threshold margin stored in the memory and corresponding to the at least one of the plurality functional paths for a respective section of the electronic circuit; and
causing, by the processing device, a first feedback operation to be performed on the first section of the electronic circuit based on the first PMM data captured during the in-field operation of the electronic circuit, and causing a second feedback operation, different from the first feedback operation, to be performed on the second section of the electronic circuit based on the second PMM data captured during the in-field operation of the electronic circuit.

2. The method of claim 1, wherein the plurality of threshold margins are determined using automatic test pattern generation (ATPG) test patterns generated using scan chains, and wherein the plurality of threshold margins and ATPG test patterns are stored in the memory as path margin monitoring (PMM) packets.

3. The method of claim 1, further comprising:
initializing a PMM idle state;
waiting for the first trigger from the processing device; and
responsive to receiving the first trigger, monitoring the at least one of the plurality of threshold margins corresponding to the at least one of the plurality functional paths in view of the previously determined threshold margin stored in the memory and corresponding to the at least one of the plurality functional paths.

4. The method of claim 3, further comprising:
determining, in response to detecting a degradation of the at least one of the plurality of functional paths, an updated threshold margin corresponding to the at least one of the plurality of functional paths that is degraded;
storing the updated threshold margin corresponding to the at least one of the functional paths that is degraded in the memory;
reinitializing the PMM idle state; and
waiting for a second trigger from the processing device.

5. The method of claim 3, further comprising:
receiving an interrupt from the processing device;
reinitializing the PMM idle state; and
waiting for a second trigger from the processing device.

6. The method of claim 1, wherein determining the plurality of threshold margins comprises:
configuring a path monitoring unit (PMU) comprising a path select multiplexer and a delay select multiplexer, the delay select multiplexer having at least one delayed input and one un-delayed input;
selecting a functional path of the plurality of functional paths using the path select multiplexer;
selecting a delayed input using the delay select multiplexer, wherein the delayed input has a delay, the delay to be applied to the selected functional path of the plurality of functional paths;
sending a functional signal via the selected functional path with the delay applied;
determining if the functional signal fails to reach an end of the selected functional path with the delay applied before a cycle of a clock signal ends;
determining, in response to the functional signal failing to reach the end of the selected functional path with the delay applied before the cycle of the clock signal ends, a threshold margin of the selected functional path based on a greatest amount of delay applied to the functional path wherein the functional signal reaches the end of the selected functional path with the delay applied before the cycle of the clock signal ends; and
storing the determined threshold margin corresponding to the selected functional path in the memory.

7. The method of claim 1, wherein the monitoring comprises:
configuring a path monitoring unit (PMU) comprising a path select multiplexer and a delay select multiplexer;
selecting a functional path of the plurality of functional paths using the path select multiplexer;
selecting a delay to be applied to the selected functional path of the plurality of functional paths using the delay select multiplexer, the functional path having an associated threshold margin of the plurality of threshold margins;
sending a functional signal via the selected functional path, the selected functional path having a functional path time; and
determining if the functional path time with the delay applied exceeds the associated threshold margin.

8. The method of claim 7, further comprising:
determining an updated functional path time and an updated threshold margin, in response to determining that the functional path time with the delay applied exceeds the associated threshold margin; and
storing the updated functional path time and updated threshold margin associated with the selected functional path in the memory.

9. A non-transitory computer-readable storage medium storing instructions which, when executed, cause a processing device to perform operations comprising:
determining a plurality of threshold margins corresponding to a plurality of functional paths in an electronic circuit;
storing the plurality of threshold margins corresponding to the plurality of functional paths in a memory;
receiving a first trigger from a processing device;
responsive to receiving the first trigger, capturing first path margin monitoring (PMM) data from a first section of the electronic circuit and second PMM data from a second section of the electronic circuit during in-field operation of the electronic circuit, wherein the first PMM data and the second PMM data each comprise at least one of the plurality of functional paths corresponding to the plurality of threshold margins in view of a previously determined threshold margin stored in the memory and corresponding to the at least one of the plurality functional paths for a respective section of the electronic circuit; and causing, by the processing device, a first feedback operation to be performed on the first section of the electronic circuit based on the first PMM data captured during the in-field operation of the electronic circuit, and causing a second feedback operation, different from the first feedback operation, to be performed on the second section of the electronic circuit based on the second PMM data captured during the in-field operation of the electronic circuit.

10. The non-transitory computer-readable storage medium of claim 9, wherein the plurality of threshold margins are determined using automatic test pattern generation (ATPG) test patterns generated using scan chains, and wherein the plurality of threshold margins and ATPG test patterns are stored in the memory as path margin monitoring (PMM) packets.

11. The non-transitory computer-readable storage medium of claim 9, the operations further comprising:

initializing a PMM idle state;

waiting for the first trigger from the processing device; and responsive to receiving the first trigger, monitoring the at least one of the plurality of threshold margins corresponding to the at least one of the plurality functional paths in view of the previously determined threshold margin stored in the memory and corresponding to the at least one of the plurality functional paths.

12. The non-transitory computer-readable storage medium of claim 11, the operations further comprising:

determining, in response to detecting a degradation of the at least one of the plurality of functional paths, an updated threshold margin corresponding to the at least one of the plurality of functional paths that is degraded;

storing the updated threshold margin corresponding to the at least one of the functional paths that is degraded in the memory;

reinitializing the PMM idle state; and waiting for a second trigger from the processing device.

13. The non-transitory computer-readable storage medium of claim 11, the operations further comprising:

receiving an interrupt from the processing device;

reinitializing the PMM idle state; and waiting for a second trigger from the processing device.

14. The non-transitory computer-readable storage medium of claim 9, the operations further comprising:

configuring a path monitoring unit (PMU) comprising a path select multiplexer and a delay select multiplexer, the delay select multiplexer having at least one delayed input and one un-delayed input;

selecting a functional path of the plurality of functional paths using the path select multiplexer;

selecting a delayed input using the delay select multiplexer, wherein the delayed input has a delay, the delay to be applied to the selected functional path of the plurality of functional paths;

sending a functional signal via the selected functional path with the delay applied;

determining if the functional signal fails to reach an end of the selected functional path with the delay applied before a cycle of a clock signal ends;

determining, in response to the functional signal failing to reach the end of the selected functional path with the delay applied before the cycle of the clock signal ends, a threshold margin of the selected functional path based on a greatest amount of delay applied to the functional path wherein the functional signal reaches the end of the selected functional path with the delay applied before the cycle of the clock signal ends; and storing the determined threshold margin corresponding to the selected functional path in the memory.

15. The non-transitory computer-readable storage medium of claim 9, the operations further comprising:

configuring a path monitoring unit (PMU) comprising a path select multiplexer and a delay select multiplexer;

selecting a functional path of the plurality of functional paths using the path select multiplexer;

selecting a delay to be applied to the selected functional path of the plurality of functional paths using the delay select multiplexer, the functional path having an associated threshold margin of the plurality of threshold margins;

sending a functional signal via the selected functional path, the selected functional path having a functional path time; and determining if the functional path time with the delay applied exceeds the associated threshold margin.

16. The non-transitory computer-readable storage medium of claim 15, the operations further comprising:

determining an updated functional path time and an updated threshold margin, in response to determining that the functional path time with the delay applied exceeds the associated threshold margin; and storing the updated functional path time and updated threshold margin associated with the selected functional path in the memory.

17. A system comprising:

a memory; and a first processing device coupled to the memory, the first processing device to:

determine a plurality of threshold margins corresponding to a plurality of functional paths in an electronic circuit;

store the plurality of threshold margins corresponding to the plurality of functional paths in the memory;

receive a first trigger from a second processing device;

responsive to receiving the first trigger, capture path margin monitoring (PMM) data from a first section of the electronic circuit and second PMM data from a second section of the electronic circuit during in-field operation of the electronic circuit, wherein the first PMM data and the second PMM data each comprise at least one of the plurality of functional paths corresponding to the plurality of threshold margins in view of a previously determined threshold margin stored in the memory and corresponding to the at least one of the plurality functional paths for a respective section of the electronic circuit; and cause, by the first processing device, a first feedback operation to be performed on the first section of the electronic circuit based on the first PMM data captured during the in-field operation of the electronic circuit, and cause a second feedback operation, different from the first feedback operation, to be performed on the second section of the electronic circuit based on the second PMM data captured during the in-field operation of the electronic circuit.

18. The system of claim 17, wherein the plurality of threshold margins are determined using automatic test pattern generation (ATPG) test patterns generated using scan chains, and wherein the plurality of threshold margins and ATPG test patterns are stored in the memory as path margin monitoring (PMM) packets.

19. The system of claim 17, the first processing device to further:

initialize a PMM idle state;

wait for the first trigger from the second processing device; and responsive to receiving the first trigger, monitoring the at least one of the plurality of threshold margins corresponding to the at least one of the plurality functional paths in view of the previously determined threshold margin stored in the memory and corresponding to the at least one of the plurality functional paths.

20. The system of claim 19, the first processing device to further:

determine, in response to detecting a degradation of the at least one of the plurality of functional paths, an updated threshold margin corresponding to the at least one of the plurality of functional paths that is degraded;

store the updated threshold margin corresponding to the at least one of the functional paths that is degraded in the memory;

reinitialize the PMM idle state; and wait for a second trigger from the second processing device.

* * * * *